United States Patent [19]

Burlage et al.

[11] 4,285,059
[45] Aug. 18, 1981

[54] CIRCUIT FOR TEST OF ULTRA HIGH SPEED DIGITAL ARITHMETIC UNITS

[75] Inventors: Donald W. Burlage; James F. Lancaster, both of Huntsville, Ala.

[73] Assignee: The United States of America as represented by the Secretary of the Army, Washington, D.C.

[21] Appl. No.: 101,927

[22] Filed: Dec. 10, 1979

[51] Int. Cl.³ .................... G06F 11/22; G01R 15/12; G01R 31/00
[52] U.S. Cl. .................................................. 371/25
[58] Field of Search ..... 371/25; 364/37, 200 MS File; 324/73 R, 73 AT

[56] References Cited

U.S. PATENT DOCUMENTS

| | | | |
|---|---|---|---|
| 3,832,535 | 8/1974 | Vito | 371/25 X |
| 3,916,306 | 10/1975 | Patti | 324/73 R |
| 3,976,940 | 8/1976 | Chau et al. | 324/73 R |
| 4,055,801 | 10/1977 | Pike et al. | 371/25 X |
| 4,092,589 | 5/1978 | Chau et al. | 324/73 R |

*Primary Examiner*—David H. Malzahn
*Attorney, Agent, or Firm*—Nathan Edelberg; Robert P. Gibson; Robert C. Sims

[57] ABSTRACT

A method is shown for testing ultra high speed digital arithmetic circuits or even complete digital signal processors which operate at speeds faster than presently available test equipment. With this technique for testing, the operating speed of digital circuits can be increased until failures occur and then quantitative information on failure rates can be measured.

2 Claims, 1 Drawing Figure

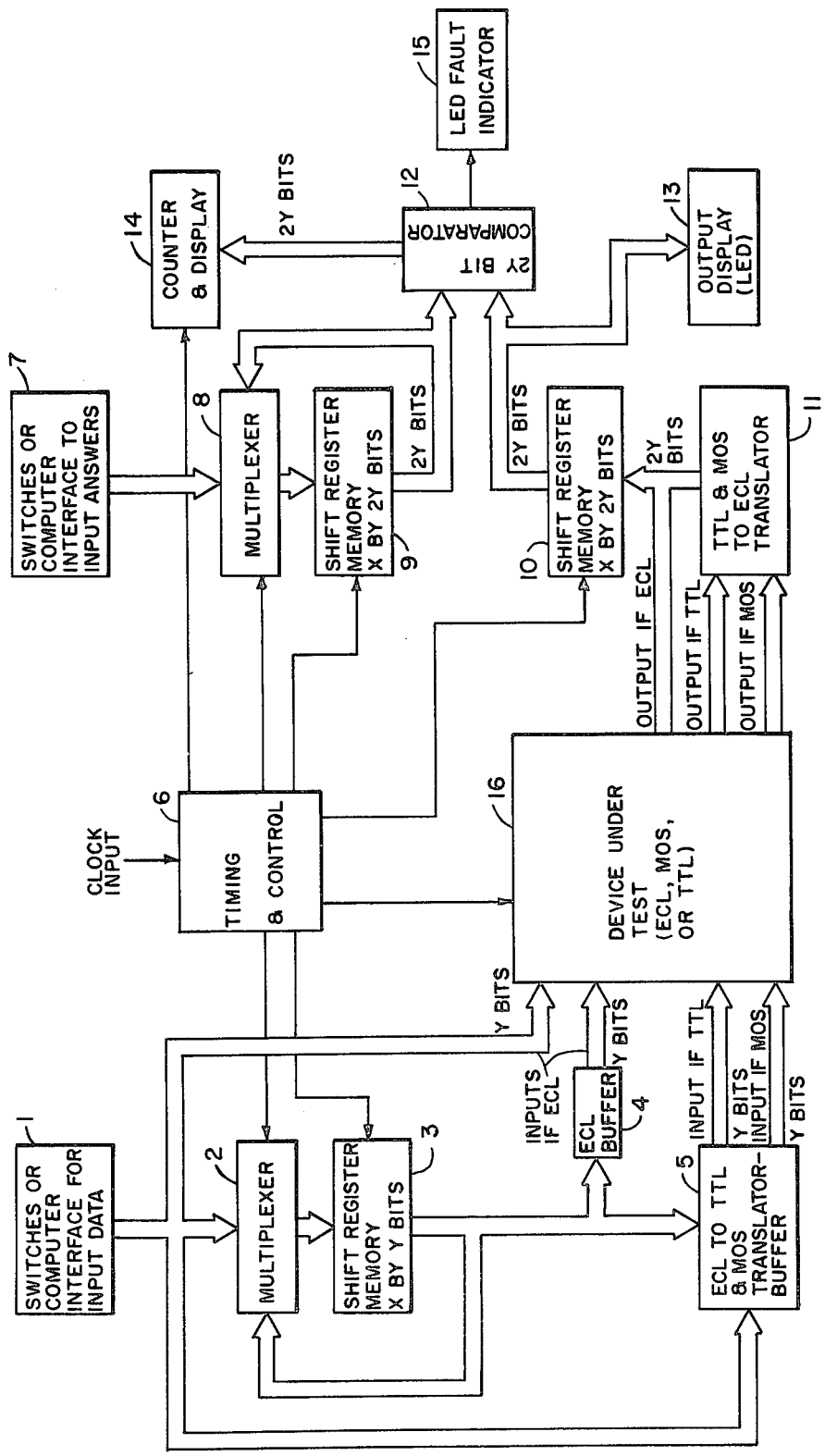

4,285,059

CIRCUIT FOR TEST OF ULTRA HIGH SPEED DIGITAL ARITHMETIC UNITS

DEDICATORY CLAUSE

The invention described herein may be manufactured, used, and licensed by or for the Government for governmental purposes without the payment to us of any royalties thereon.

BACKGROUND OF THE INVENTION

This invention is used to evaluate the performance of primarily ultra high speed digital circuits; although circuits built with any speed logic can be tested. Conventional evaluation techniques are either limited in speed and cannot be used to test the fastest available logic at rated speed or if operated at the desired speed do not provide for precise monitoring of the logic performance. The circuit described here operates at state-of-the-art speeds and gives exact measurements of outputs from the digital unit under test.

A technique which is often used to test digital arithmetic and signal processor circuits is to apply a test signal from an analog signal generator through an analog-to-digital (A/D) converter to the circuit under test. The digital output of the circuit is then applied to a digital-to-analog (D/A) converter so that the equivalent analog output signal can be observed on an oscilloscope or some other suitable recording device. The fundamental speed limitation of this test procedure is the A/D converter. Available 16-bit word plus 16-bit word digital adder circuits perform additions in 10 nsec or less. This addition speed would require a 16-bit output word A/D converter with a sampling rate of at least $1/(10\text{ nsec}) = 100$ MHz, well beyond the state-of-the-art conversion which is approximately 16 bits at 200 KHz. Even if an A/D converter was available to generate the digital input at the desired speed, the D/A converter will eventually limit the maximum speed and both converters have inaccuracies which mask the performance of the circuit under test.

Another common technique to test digital arithmetic is to use a "digital data simulator" to input digital words to the circuit under test from some sort of digital memory. By inputing words from a controlled digital source the inaccuracies of the A/D are eliminated. Commercial data simulators which are nothing but digital memories that can be stored with desired digital data are available to generate sequences of digital words for input to the arithmetic unit. However, the commercial testers are often time limited in maximum speed of operation, and, more importantly, provide no observation of the test unit outputs. A D/A converter is normally used to monitor the output. Another possibility for monitoring is to observe single bits of the output words on an oscilloscope, a technique that provides little information about the overall circuit operation.

BRIEF DESCRIPTION OF THE DRAWING

The single FIGURE illustrates in block diagram form the basic embodiment of the present invention.

DESCRIPTION OF THE PREFERRED EMBODIMENT

Digital logic arithmetic units such as adders or multipliers are used extensively in many areas of logic system design, especially in digital signal processing systems for radar where they must operate at a high rate of speed. A device suitable for testing a logic arithmetic unit should be able to determine whether or not the proper logic operations are being performed at the maximum rated speed of the device. The high speed test unit explained here is capable of entering data to a logic device, recording the results and indicating faults at the full rated speed of the device under test. Other test devices are not capable of all these operations. As described above, some test equipment consists of a means of entering data to a device under test at rated operating speeds but does not make provisions for accurate recording or checking outputs at rated speed. Other equipment allows static entry of data and recording of outputs but does not meet the requirement for dynamic or "rated speed" operation.

The invention uses high speed shift registers for storage of digital words to input to the digital device under test in a manner similar to the previously described digital data simulator techniques. In addition, unlike previous techniques, it provides high speed circuitry to simultaneously check each bit of the output word with a correct answer, indicate any errors and count the errors. This ability to precisely check each bit of the test circuit output when operating at maximum state-of-the-art speeds and then record errors is the primary contribution of this invention A software package on a general purpose computer can be used to generate the digital word sequence that is stored in the input shift registers and to calculate the corresponding correct answer digital sequences. Another improved feature is the provision of logic translators so that high speed circuits constructed from either transistor-transistor-logic (TTL), emitter-coupled-logic (ECL), or metal-oxide-semiconductor (MOS) logic can be tested.

The invention may be best understood by referring to the drawing. The blocks of this diagram represent known digital circuits that perform simple logic functions. The circuits are interconnected by data buses shown as heavy lines and by timing and control lines shown as single lines. Digital words are transferred along the data buses with the y bits that make up each word being transferred in parallel. In other words, the data bus is y single lines with one bit of the word on each line. With the exception of the translators, all the blocks of the tester are implemented with ECL logic since this type of logic provides the fastest operation. The translators, blocks 5 and 11, are devices required to interface between ECL logic of the tester and either the TTL or MOS logic of the device under test. Blocks 5 and 11 are made up of old and well known interfaces whose selection will be obvious to one skilled in the art from the selection of the test device 16.

The test set is programmed to test a digital device 16 by using devices 1 and 7 to input data and answers. These inputs may be either manually entered with switches or entered automatically from a general-purpose computer memory. Most arithmetic devices require two digital words to be simultaneously input—the multiplier and multiplicand or addend and augend, for example. One of these two input words is entered from 1 through the multiplexer 2 to a shift register memory 3 for storage. The arrangement of the shift register in x by y bits allows x consecutive words of y bits each to be entered so that x consecutive arithmetic operations at rated speed can be performed. Continuous operations are performed by recirculating these x words back into the shift register through the multiplexer as many times as desired. The multiplexer is nothing more than a switch which allows digital data to be entered into the shift register from either block 1 or the output of block 3. For the second input word needed for each operation, a constant is used and it is obtained from block 1. Buffer circuit 4 is used to provide the necessary current levels to drive the logic under test. A similar driver circuit is included in block 5 for the other two logic types. Answers from the device under test are clocked into the x by 2y bit shift register 10 through the translator 11, if needed. The memory of 10 stores x consecutive answers, each of which can be up to 2y bits in length. The longer answer length is needed for the test of multipliers because the multiplication of two y bit words gives a product of 2y bits in length. When the test device is an adder or subtractor, y+1 bits will be needed because when y bit words are added or subtracted, the answer can be a maximum of y+bits in length. The test device answers from block 10 are compared in comparator 12 to the outputs of a correct answer shift register 9 which can be preprogrammed with the expected x word output sequences. Preprogramming, storage, and recirculation of expected answers are accomplished with blocks 7, 8, and 9 in the exact same manner of blocks 1, 2, and 3 for the input words. The circuit of block 12 compares each bit of the correct answer word with each bit of the test device output word and produces a fault indication when there is a difference. By allowing the tester to run continuously, data can be obtained on the frequency of error with the counter of block 14. Light emitting diodes (LED) 15 are used to indicate each occurrence of an error in comparator 12 to display in block 13 the 2y bits of the output answer when the tester is stopped or run at a sufficiently slow speed, and to display in block 14 the cumulative count of errors. Operation of the tester is governed by a timing and control circuit 6, so that inputs are entered to the device under test at a controlled rate. The circuit of 6 also controls which answers are compared; e.g. consecutive answers may be checked and errors counted for many cycles through the x input words stored in shift register 3 or, perhaps, only x operations would be performed at rated speed with the answers stored in 10 and then the x answers read out at a slow speed and observed with the LED display 13 to allow a more precise determination of the failure mechanism. These various modes make the test set more versatile than previous type of tester.

The first step in the operational cycle of the tester is to set the multiplexers 2 and 8 so that input data and correct answers can be input to registers 3 and 9, respectively. The second step is to throw the switches on 1 and 7 for the first of the x input and answer words, and then clock the two words into the registers 3 and 9. This continues in the same manner until all x inputs and x answers are loaded into the two registers. At that time the multiplexers are set so that the data in 3 and 9 can be recirculated and the switches on 1 are set to the constant word to be used in the circuit test. The next step is to connect the unit to be tested to the proper output and input of the tester, depending on the type of logic from which it is constructed. Then, the timing and control circuit is set to run the tester at the desired speed and to record the desired number of comparisons. The final step is to start the clock to run the test and observe the results.

We claim:

1. A method for testing ultra high speed digital equipment comprising the steps of selecting an input signal to be fed through the digital equipment; storing this input signal in a first shift register; selecting an expected output signal which should be presented if the input signal was fed through said digital equipment; storing this expected output signal in a second shift register; feeding the input signal from the first shift register into the digital equipment; and comparing the output from the digital equipment with the expected output signal stored in the second shift register to detect faults.

2. A method as set forth in claim 1 further comprising the steps of recirculating the input signal out of the first shift register back into the input of the first shift register so as to provide consecutive insertions of the input signal into the digital equipment; and recirculating the output of the expected output signal of the second shift register back into the input of the second shift register so as to provide consecutive outputs of the expected output signal so that they can be compared with the outputs of the digital equipment.

* * * * *